United States Patent
Sato et al.

(10) Patent No.: US 6,407,545 B1
(45) Date of Patent: Jun. 18, 2002

(54) APPARATUS AND METHOD FOR MEASURING REMANENCE CURVE OF A MAGNETIC MATERIAL

(75) Inventors: Kenji Sato; Takuya Uzumaki, both of Kanagawa; Tadashi Mizoguchi, Tokyo, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/442,261

(22) Filed: Nov. 17, 1999

(30) Foreign Application Priority Data

Mar. 24, 1999 (JP) ............................................. 11-080350

(51) Int. Cl.$^7$ ............................................. G01R 33/12
(52) U.S. Cl. ......................................... 324/212; 360/25
(58) Field of Search ................................. 324/212, 205, 324/223, 235, 229, 230, 244.1, 232, 239; 210/695; 360/53, 25, 135, 137; 359/280; 369/53.2, 53.41

(56) References Cited

U.S. PATENT DOCUMENTS 6,201,386 B1 * 3/2001 Jones et al. .................. 324/205

FOREIGN PATENT DOCUMENTS

| JP | 5559353 | 5/1980 |
| JP | 58144766 | 8/1983 |
| JP | 63122930 | 5/1988 |
| JP | 196574 | 4/1989 |
| JP | 7167868 | 7/1995 |
| JP | 8278358 | 10/1996 |

OTHER PUBLICATIONS

W.D. Doyle, et al., Magnetization Reversal at High Speed—An Old Problem in a New Context, Technology and Department of Physics and Astronomy, The University of Alabama, vol. 22, No. 3, 1998, pp. 91–106.

T. Mizoguchi, et al., Remanence in High–Density Recording Media, Faculty of Science, Gakushuin University, Physics B, pp. 21–24, 2000.

* cited by examiner

Primary Examiner—Walter E. Snow
(74) Attorney, Agent, or Firm—Greer, Burns & Crain, Ltd.

(57) ABSTRACT

An apparatus and a method for measuring the remanence curve of a magnetic material with high accuracy is disclosed. First and second pulse magnetic field coils generate a rapidly-changing pulse magnetic field in the space where a magnetic material is located. First and second air-core coils generate a space of a zero magnetic field as well as a finite magnetic field gradient around the magnetic material after application of a pulse magnetic field. A detector detects the force generated by the cooperation between the magnetic field gradient and the magnetic moment of the magnetic material. An arithmetic unit 33 determines the residual magnetization characteristic of the magnetic material based on the detection result in the detector.

24 Claims, 11 Drawing Sheets a: VERTICAL MAGNETIZATION FILM VERTICAL MAGNETIC FIELD APPLIED
b: IN-PLANE MAGNETIZATION FILM IN-PLANE MAGNETIC FIELD APPLIED
c: IN-PLANE MAGNETIZATION FILM 45° MAGNETIC FIELD APPLIED
d: VERTICAL MAGNETIZATION FILM 45° MAGNETIC FIELD APPLIED

APPARATUS AND METHOD FOR MEASURING REMANENCE CURVE OF A MAGNETIC MATERIAL

FIELD OF THE INVENTION

The present invention relates to an apparatus and a method of measurement used for evaluating the remanence magnetization curve (hysteresis characteristic, residual magnetization characteristic, etc.) of a magnetic material (magnetic recording medium) such as a magnetic disk device. More particularly this invention relates to an apparatus and a method of measurement used for evaluating the characteristics of a super-high density magnetic material.

BACKGROUND OF THE INVENTION

The recording density of the magnetic disk device thus far used as an external storage unit of the computer has increased at a surprising rate of 100 times for each decade. Critical factors that have contributed to such an increase in the recording density at this rate are improvement in the data transfer rate, reduction in the thickness of the magnetic material, reduction in the size of crystal particles constituting the magnetic material, etc. With the recent progress in reduction in the thickness of the magnetic material and the size of crystal particles, the ever decreasing volume of the magnetic members has caused an unstable direction of magnetization under the thermal effect and easy disappearance of the recording data. This phenomenon of thermo-magnetic relaxation has cropped up as a problem constituting a bottleneck to a higher density.

Further, with the increase in the data transfer rate, the problem of an increased effective coercive force of the magnetic material has come up, giving rise to the fear of degradation in the overwriting characteristic. If only to overcome this problem in developing a magnetic disk device, an apparatus has been required for measuring and evaluating the remanence magnetization curve of a magnetic material accurately in accordance with practical conditions.

A magnetic material remanence curve measuring apparatus that evaluates the remanence magnetization courve (hysteresis characteristic, residual magnetization, etc.) of the magnetic material during the development of a magnetic disk apparatus is know in the prior art. By feeding back the evaluation result obtained by such a magnetic material remanence curve measuring apparatus, the remanence magnetization courve of the magnetic material are improved in such a way that they meet the high density requirement. Thus, the development of the magnetic material remanence curve measuring apparatus plays a very important role as a measuring instrument aimed at a higher density.

Methods of this type for measuring the remanence curve of the magnetic material include the VSM (Vibrating Sample Magnetometer), an electromagnetic induction method using the SQUID (Superconducting QUantum Interference Device) well known as a superconductive quantum interferometer, the Faraday method using AGM (Alternative Gradient Magnetometer) and a method using the magneto-optical effect (Kerr effect). In the VSM, a sample (a magnetic material, for example) placed and magnetized in the air gap between an electromagnet is vibrated vertically with a small amplitude at a predetermined frequency, and the magnetic field generated by this magnetized sample is used to generate vibration magnetic fluxes in a search coil arranged in the neighborhood of the sample. Then, the magnetization is measured based on an AC signal generated in the search coil. Magnetization is measured while exerting an external magnetic field statically changing over a very long time of 10 to 20 minutes on the sample.

The SQUID, on the other hand, is a high-sensitivity magnetic sensor capable of detecting a very weak magnetic field equivalent to not more than one 50 millionth of the Earth's magnetic field by use of the superconductive quantization. This device is used in an environment maintained at a very low temperature utilizing liquid helium or the like. Specifically, this SQUID is a device formed by micromachining a superconductive thin film so that weak superconductive junctions are parallel to each other. The voltage across the device undergoes a change as a magnetic field is applied thereto from a sample with the bias current fixed at about the critical current value. By grasping this voltage change, the strength of the magnetic field can be measured.

Further, the Kerr effect measuring apparatus that measures the remanence magnetization curve using the Kerr effect described above is disclosed in Japanese Patent Application Laid-Open No. SHO 63-122930. This apparatus comprises light condensing means for condensing a polarized laser beam and radiating it on a magnetic material, magnetic field generating means f or applying a magnetic field to a magnetic material, and means for detecting the polarized state of the laser beam reflected from the magnetic material. In this Kerr effect measuring apparatus, the remanence magnetization curve of the magnetic material is measured taking advantage of the fact that the rotational angle of the polarization plane of the reflected laser beam detected by the detecting means when the magnetic field of the magnetic field generating means is changed undergoes a change in accordance with the direction in which the magnetic material is magnetized.

Still another apparatus for measuring the remanence curve of a magnetic material is a pulse magnetic field application and measuring apparatus. This apparatus comprises a coil for generating a pulse magnetic field, a power supply for supplying power to the pulse magnetic field generating coil, a detection coil arranged at the central potion of the pulse magnetic field generating coil, and a measuring unit for measuring the remanence magnetization curve of the sample disposed in the neighborhood of the detection coil based on the eIectromotive force generated in the detection coil.

In the prior art, a magnetic material has been developed, which has a remanence magnetization curve capable of standing a high density recording by evaluating the characteristics of a sample based on the measurements obtained from the various apparatuses described above for measuring the remanence curve of a magnetic material. Specifically, the film thickness and the size of crystal particles are reduced, and the thermal dependency of the coercive force in the magnetic material is improved. In the magnetic material remanence curve measuring apparatuses other than the pulse magnetic field application and measuring apparatus described above, the write operation by the magnetic head of the magnetic disk device is simulated by applying a magnetic field to the sample that changes at low speed over a time span of 10 to 20 minutes and the remanence magnetization curve of the sample are measured.

In the actual magnetic disk device, the rate of change of the magnetic field of the magnetic head of the magnetic material reaches the order of as high as several MHz to several tens of MHz due to the greatly increased data transfer rate constituting an important factor of high density recording. In the various conventional apparatuses for measuring the remanence curve of the magnetic material (except for the pulse magnetic field application and measuring apparatus), on the other hand, the change rate of the magnetic field applied to the sample is in the order of 10 to 20 minutes, which is considerably different from the actual change rate (several MHz to several tens of MHz) of the magnetic field of the magnetic disk device.

Specifically, in the conventional magnetic material remanence curve measuring apparatus, the conditions under which the magnetic field is applied to the sample fail to meet practical requirements. With the recent progress of reduction in the thickness of a magnetic film and the size of magnetic particles in the magnetic material, the problem has cropped up that the resulting remanence magnetization curve are considerably different from the remanence magnetization courve for practical applications. As a specific example, the measurement of 2500 (Oe) was obtained as a coercive force of a sample by the VSM in a recently developed magnetic material. The effective coercive force for practical applications, however, is something about 5000 (Oe) (theoretical value). Thus, the difference (measurement error) is as large as 2500 (Oe).

Assume that a magnetic material having an apparent coercive force of 2500 (Oe) is built in a magnetic disk device believing in the measurement of the apparatus for measuring the remanence curve of the magnetic material described above. The magnetic head will be designed to overwrite the magnetic material in an applied magnetic field of at least 5000 (Oe) of coercive force. In view of the fact that the actual coercive force of the magnetic material is 5000 (Oe), however, the very serious situation occurs that the overwrite operation is impossible even when the magnetic field of 5000 (Oe) is applied to the magnetic material at the magnetic head. In other words, in the conventional apparatus for measuring the remanence curve of the magnetic material (except for the pulse magnetic field application and measuring apparatus), a disagreement develops between the measurement of the remanence magnetization curve and the remanence magnetization curve for practical applications. This poses a very serious problem that the overwrite characteristic is deteriorated by the increased effective coercive force.

In the pulse magnetic field application measuring apparatus, on the other hand, the magnetic field can be changed with rapidity by the pulse magnetic field. The resulting advantage is that a rapidly-changing magnetic field can be exerted on the sample under conditions similar to practical applications. Nevertheless, in view of the fact that the electromotive force generated in the detection coil is detected by use of the electromagnetic induction, a minor magnetic moment such as that of a magnetic material cannot be detected. Thus, the pulse magnetic field application measuring apparatus, though effective for the sample having a large magnetic moment, is not suitable for measuring the remanence magnetization curve of the magnetic material of which the reduction in thickness is going on.

SUMMARY OF THE INVENTION

The present invention has been developed in view of the points described above. It is the object of the present invention is to provide an apparatus and a method for measuring the remanence curve of a magnetic material with high accuracy under measurement conditions meeting practical requirements.

In the first aspect of the present invention, a pulse magnetic field is applied to the magnetic material and rapidly changed with the help of a pulse magnetic field applying unit. This is very similar to the state in which the magnetic field is generated by the magnetic head with the magnetic material built in a magnetic disk device. After the pulse magnetic field is applied, the remanence magnetization courve are measured by a measuring unit based on the principle of detecting the force that the magnetic moment receives from the magnetic field gradient. As compared with the conventional detection coil, therefore, a high sensitivity is obtained even for a magnetic material having a very small magnetic moment. In this way, according to the first aspect of the present invention, the measurement meeting the practical conditions can be obtained with a higher accuracy.

In the present invention according to the second aspect, a pulse magnetic field is applied to the magnetic material and rapidly changed with the help of a pulse magnetic field applying unit and the remanence magnetization curve are measured by a measuring unit based on the detection result of the polarized state of the light utilizing the Kerr effect. This case is also similar to the situation in which the magnetic field is generated by the magnetic head with the magnetic material built in a magnetic disk device. Further, a high sensitivity as compared with the conventional detection coil is secured even with a magnetic material having a very small magnetic moment. In this way, according to the second aspect of the present invention, the measurements meeting practical requirements can be obtained with a higher accuracy.

In the present invention according to the third aspect, the pulse magnetic field that changes as rapidly as 100 ns to 100 ms is applied with the help of a pulse magnetic field applying unit. As a result, the remanence magnetization courve can be measured under the conditions very similar to the practical conditions of a hard disk device or the like.

In the fourth aspect of the present invention, the angle of arrangement of the magnetic material is adjusted to arbitrary degrees with the help of a angle adjusting unit. Therefore, an actual head magnetic field having an angular component can be produced in simulation, and thus not only conditions meeting practical applications can be produced but also variations of measuring methods can be increased.

In the fifth aspect of the present invention, a space having a zero magnetic field and a finite magnetic field gradient is generated with the help of a magnetic field gradient generating unit. Therefore, the residual magnetization (remanence magnetization curve) of the magnetic material after application of the pulse magnetic field can be measured very accurately.

In the sixth aspect of the present invention, a steady magnetic field is exerted on the magnetic material with the help of a steady magnetic field generating unit, and therefore the remanence magnetization curve of the magnetic material in the steady magnetic field (external magnetic field) can be measured for an improved general purpose applicability. Further, in the sixth aspect of the present invention, the change of the remanence magnetization curve in the steady magnetic field is measured by use of the Kerr effect.

In the eighth aspect of the present invention, a pulse magnetic field is applied to the magnetic material and rapidly changed. This situation is very similar to the one in which a magnetic field is generated by a magnetic head with the magnetic material built in the magnetic disk device. In the measuring process after application of the pulse magnetic field, the remanence magnetization courve are measured according to the principle of detecting the force received by the magnetic moment from the magnetic field gradient. As compared with the conventional detection coil, therefore, a high sensitivity is obtained even with a magnetic material having a very small magnetic moment. In this way, according to the present invention of the eighth aspect, the measurements meeting practical conditions can be secured for an improved accuracy of the measurements.

In the ninth aspect of the present invention, a pulse magnetic field is applied to the magnetic material and rapidly changed, further, the remanence magnetization curve is measured based on the detection result of the polarized state of the light utilizing the Kerr effect. This case is also similar to the situation in which the magnetic field is generated by the magnetic head with the magnetic material built in a magnetic disk device. Further, a high sensitivity as compared with the conventional detection coil is secured even with a magnetic material having a very small magnetic moment. In this way, according to the ninth aspect of the present invention, the measurements meeting practical conditions can be secured with a higher measurement accuracy.

In the tenth aspect of the present invention, the space of a zero magnetic field and a finite magnetic field gradient is generated, and therefore the residual magnetization (remanence magnetization curve) in the magnetic material after application of a pulse magnetic field can be measured very accurately.

In the eleventh aspect of the present invention, a steady magnetic field is exerted on the magnetic material, and therefore the remanence magnetization courve of the magnetic material in the steady magnetic field (external magnetic field) can also be measured, thereby improving the general purpose applicability.

Other objects and features of this invention will become apparent from the following description with reference to the accompanying drawings.

DESCRIPTION OF THE PREFERRED EMBODIMENTS

The apparatus and the method for measuring the remanence curve of a magnetic material according to an embodiment of the present invention will be described in detail with reference to the accompanying drawings.

Figure 1:
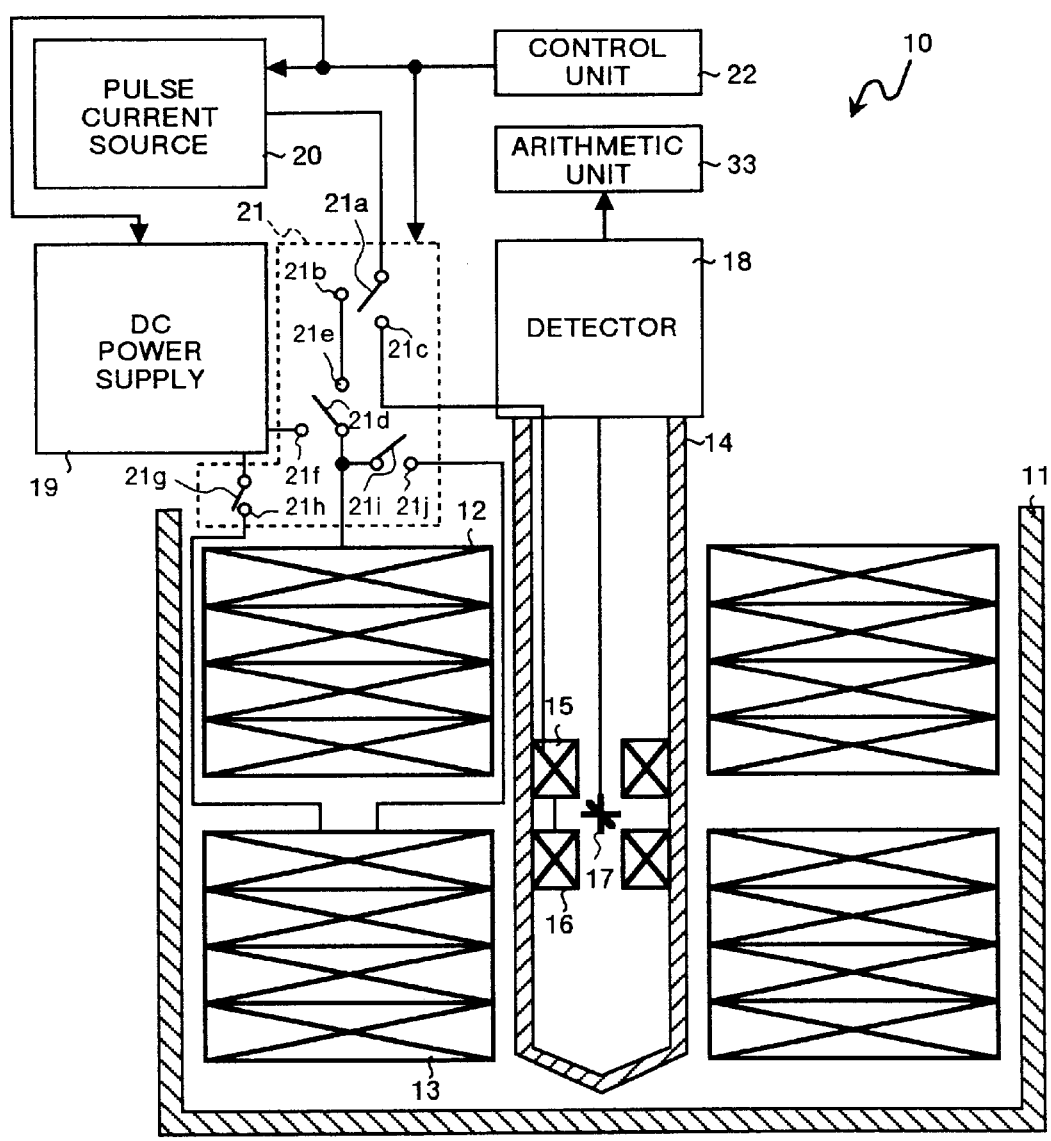
FIG. 1 is a diagram showing a configuration of an apparatus 10 for measuring the remanence curve of a magnetic material according to an embodiment of the present invention.

FIG. 1 is a diagram showing a configuration of an apparatus 10 for measuring the remanence curve of a magnetic material according to an embodiment of the present invention. In FIG. 1, an insulated vessel 11 is configured of a double insulated structure having two vessel units, for example, of which the exterior and the interior are insulated from each other. A first air-core coil 12 and a second air-core coil 13 are arranged at upper and lower positions along the inner peripheral surface of the insulated vessel 11 for generating a magnetic field corresponding to the direction of the current supplied thereto in a magnetic material 17 located at the center of the vessel 11. Also, the first air-core coil 12 and the second air-core coil 13 are configured of four-stage coils, respectively.

The magnetic field generated at the central position (where the magnetic material 17 is located) by the first air-core coil 12 and the second air-core coil 13 is of three types including the zero magnetic field, the steady magnetic field and the pulse magnetic field. The zero magnetic field, in which the magnetic field is zero and the magnetic field gradient is finite, is obtained by supplying DC currents in opposite directions to the first air-core coil 12 and the second air-core coil 13. Specifically, a current in positive (or negative) direction is supplied to the first air-core coil 12, while a current in negative (or positive) direction is supplied to the second air-core coil 13 at the same time. Thus, a zero magnetic field is obtained at the position of the magnetic material 17.

On the other hand, the steady magnetic field, which is obtained by supplying DC currents in the same direction to the first air-core coil 12 and the second air-core coil 13, is a magnetic field of a value corresponding to the DC currents. Assume that the liquid nitrogen is filled in the insulated vessel 11 and the first air-core coil 12 and the second air-core coil 13 are cooled thereby to allow a large current to flow. Then the steady magnetic field can be increased up to 1T. Further, the pulse magnetic field, which is obtained by supplying a pulse current to the first air-core coil 12 and the second air-core coil 13, has a comparatively long pulse width. Applications of the zero magnetic field, the steady magnetic field and the pulse magnetic field described above will be explained in more detail with reference to a measuring method later.

A container 14 is arranged along the inner peripheral surface of the first air-core coil 12 and the second air-core coil 13 and has an opening in the upper surface thereof. A first pulse magnetic field coil 15 and a second pulse magnetic field coil 16 are arranged at the central portion of the first air-core coil 12 and the second air-core coil 13, respectively, along the inner peripheral surface of the container 14. The first pulse magnetic field coil 15 and the second pulse magnetic field coil 16 are for generating a rapidly-changing pulse magnetic field by supplying a pulse current at the magnetic material 17 is located. The direction of the pulse magnetic field is controlled by reversing the flow of the pulse current in positive and negative directions.

Figure 2:
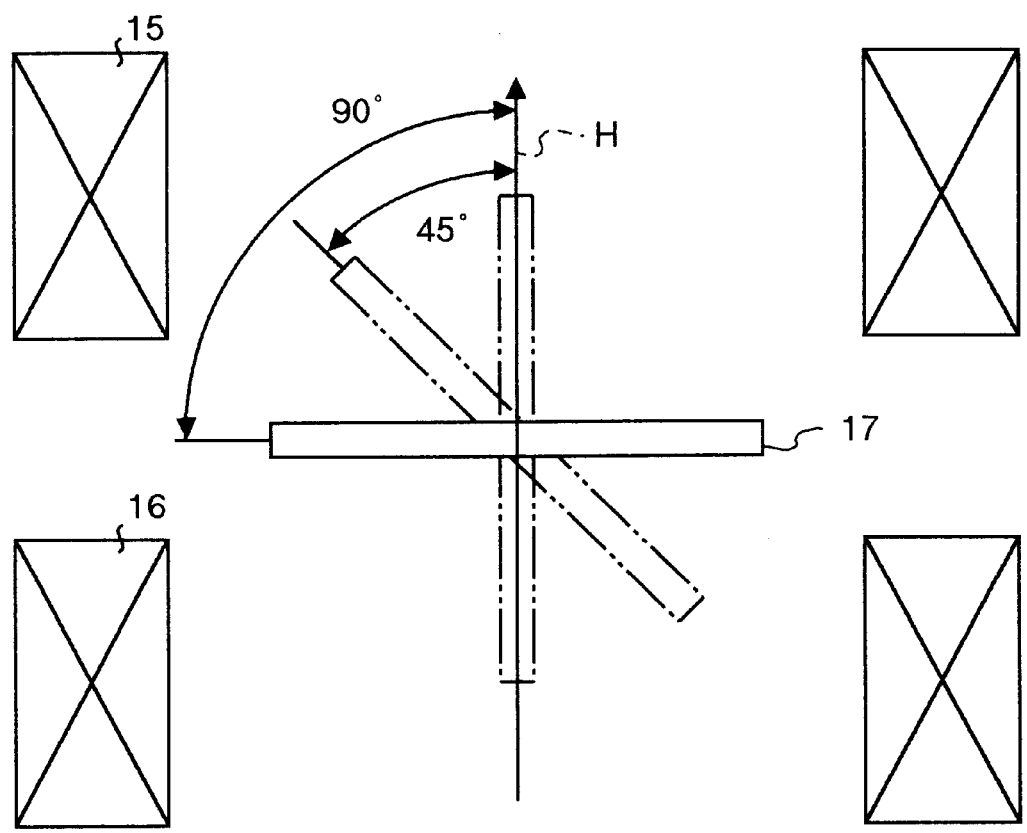
FIG. 2 is a side view showing the position where the magnetic material 17 shown in FIG. 1 is arranged.

A magnetic material 17 is a sample to be measured and is configured of a hard magnetic material or a semi-hard magnetic material. This magnetic material 17 is used with a magnetic disk device. A sample for the magnetic material remanence courve measuring apparatus 10 is not limited to the magnetic material 17 but may be any kind of hard (semi-hard) magnetic material. The magnetic material 17 as referred herein, therefore, includes a common hard magnetic material (semi-hard magnetic material). Also, as shown in FIG. 2, the magnetic material 17 is held by a holder (not shown) so that the angle at which it is arranged with respect to the magnetic field H generated is changeable to 0°, 45° or 90°. As a result, the variations of the measuring method are increased.

Figure 3:
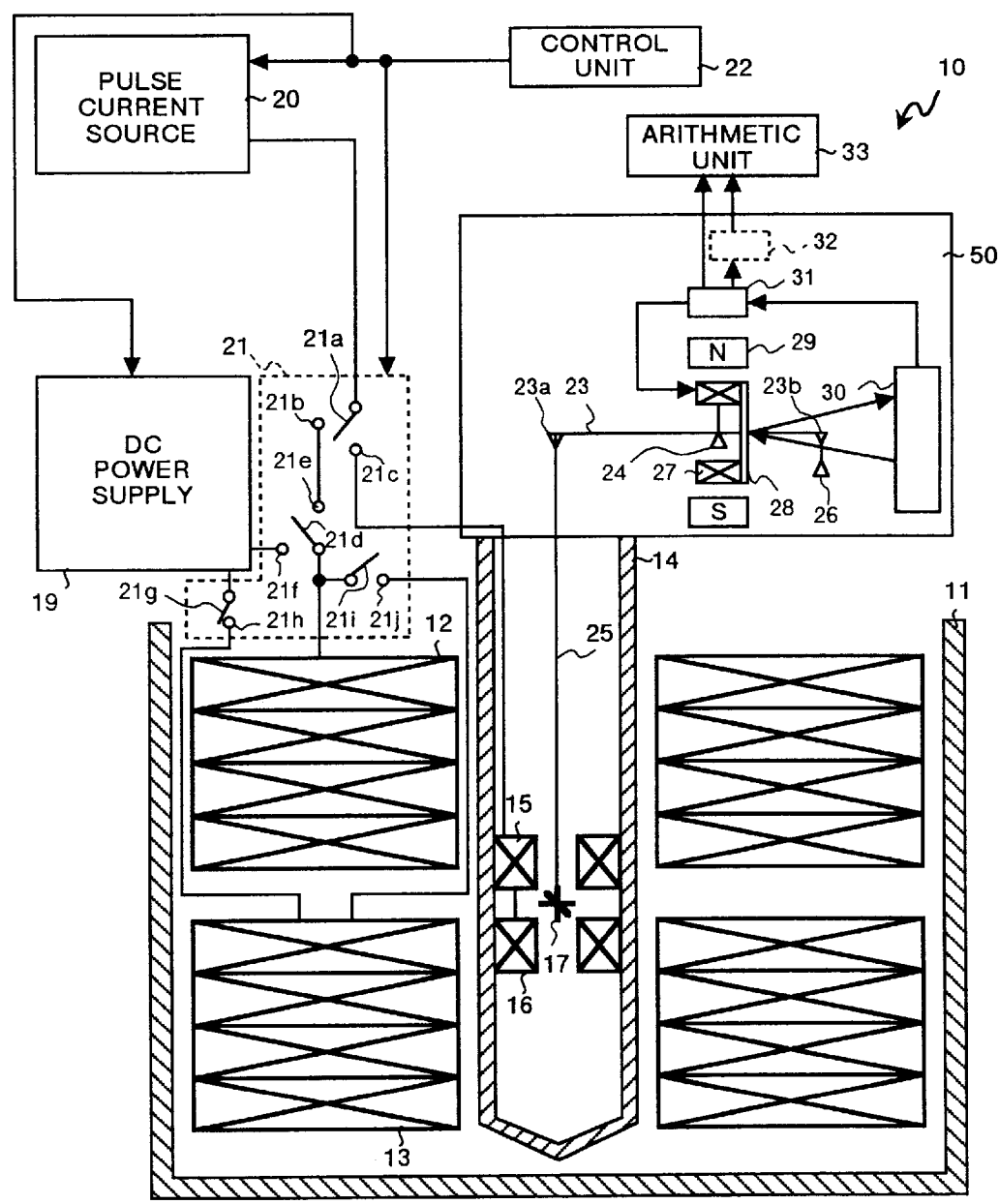
FIG. 3 is a diagram showing a configuration of the apparatus 10 for measuring the remanence curve of the magnetic material using a magnetic balance 50 according to an embodiment of the present invention.
Figure 4:
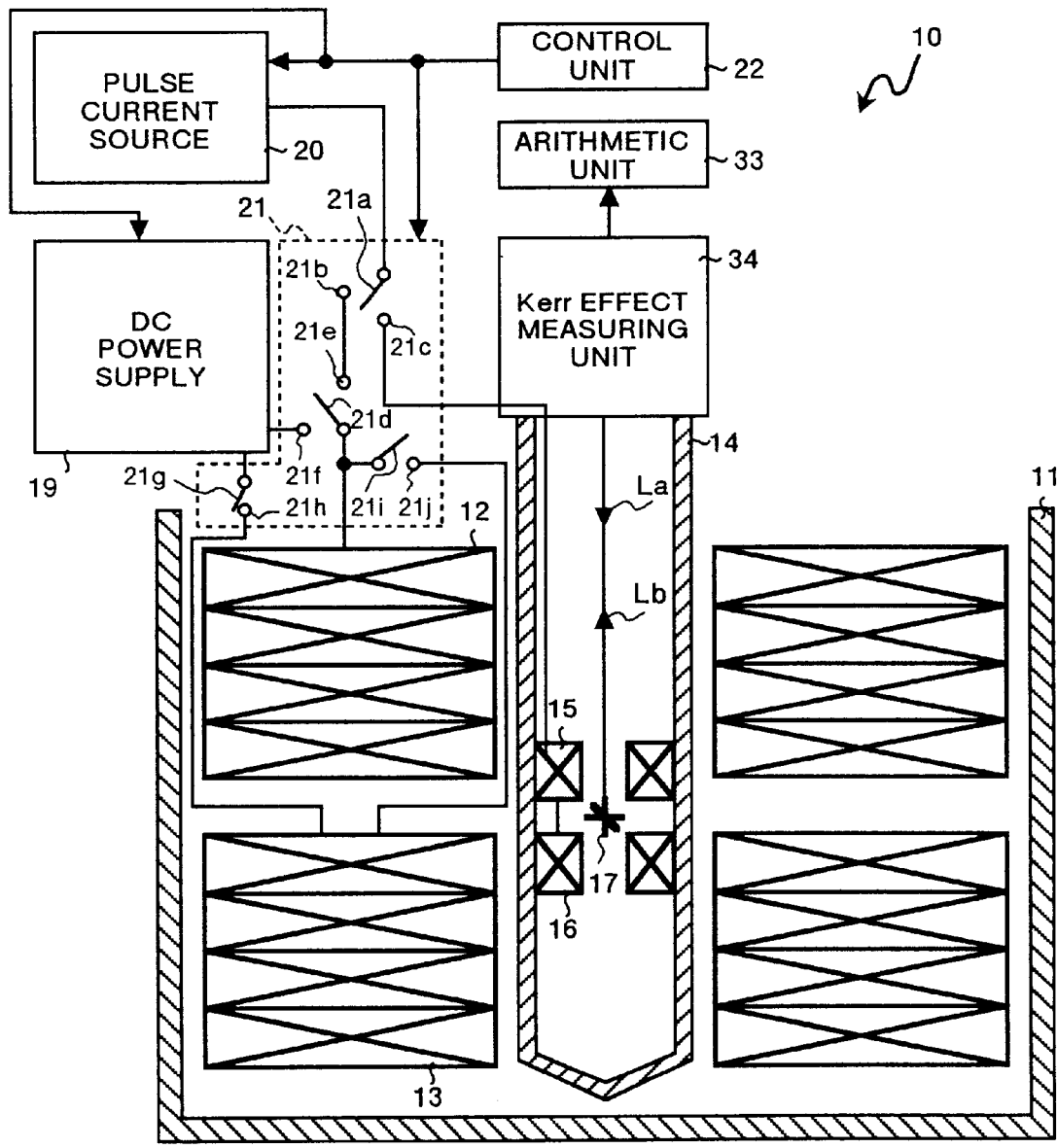
FIG. 4 is a diagram showing a configuration of the apparatus 10 for measuring the remanence curve of the magnetic material using a Kerr effect measuring unit 34 according to an embodiment of the present invention.

A detector 18 (arithmetic unit 33) which is for detecting the residual magnetization (magnetization) of the magnetic material 17 with high sensitivity by utilizing Faraday method or the Kerr effect, is mounted at the upper end of the container 14 located above the magnetic material 17. Actually, a magnetic balance 50 shown in FIG. 3 or a Kerr effect measuring unit 34 shown in FIG. 4 is used as the detector 18 depending on the measurement involved. The magnetic balance 50 and the Kerr effect measuring unit 34 will be described in detail later.

A DC power supply 19 has two output terminals for supplying a positive (negative) DC current to the first air-core coil 12 and the second air-core coil 13 through a switch 21. The direction of the DC current output from the two output terminals of the DC power supply 19 is controlled by a control unit 22. Specifically, the DC power supply 19, under the control of the control unit 22, can output a positive (negative) DC current from both the two output terminals, or a positive DC current from one of the two output terminals and a negative DC current from the other output terminal. One of the output terminals of the DC power supply 19 is connected to the first air-core coil 12 through the switch 21, and the other output terminal of the DC power supply 19 is connected to the second air-core coil 13 through the switch 21.

A pulse current source 20, which is configured of a condenser bank having a large capacity, can be connected through the switch 21 to the first pulse magnetic field coil 15, the second pulse magnetic field coil 16, the first air-core coil 12 and the second air-core coil 13. This pulse current source 20 supplies a pulse current to the first pulse magnetic field coil 15 and the second pulse magnetic field coil 16 or the first air-core coil 12 and the second air-core coil 13 by discharge when a thyristor not shown is turned on. The pulse current source 20 is configured of, for example, three parallel condenser banks each having a capacity of 0.8 mF for the total capacity of 2.4 (0.8×3) mF.

The switch 21 is for switching the connection between the DC power supply 19 and the pulse current source 20, between the first air-core coil 12 and the second air-core coil 13 and between the first pulse magnetic field coil 15 and the second pulse magnetic field coil 16 under the control of the control unit 22. The switch 21 includes a movable contact 21a, a contact 21b and a contact 21c for switching the pulse current output from the pulse current source 20 to the first pulse magnetic field coil 15 (second pulse magnetic field coil 16) or the first air-core coil 12 (second air-core coil 13).

A movable contact 21d, a contact 21e and a contact 21f (a movable contact 21i and a contact 21j) make up a switch for connecting the first air-core coil 12 (the second air-core coil 13) to the DC power supply 19 or the pulse current source 20. A movable contact 21g and a contact 21h are inserted between the other output terminal of the DC power supply 19 and the second air-core coil 13. The switch 21 may be any kind of switch such as a mechanical switch (magnet switch or the like) for performing the switching operation mechanically or a no-contact switch including a thyristor, etc.

Now, the magnetic balance 50 will be described in detail with reference to FIG. 3. The magnetic balance 50 is an application of the principle of the Faraday method. The force received by the magnetic moment of the magnetic material 17 from the magnetic gradient is detected thereby to detect the residual magnetization of the magnetic material 17. As far as the magnetic gradient (110 Oe/cm (875 kA/m$^2$)) is constant, the magnetic balance 50 acts as a detector of high sensitivity (magnetic moment detection sensitivity: 2×10$^{-9}$ Am$^2$ (1×10$^{-6}$ emu (1×10$^{-5}$ Am$^2$))). In order to assure a constant magnetic gradient, the second air-core coil 13 and the first air-core coil 12 are used. The magnetic balance 50, in which a balance beam 23 is supported on a supporting point 24, seesaws in accordance with the difference of the forces exerted on one end 23a and the other end 23b. In the case where the same force is exerted on the ends 23a and 23b of the beam 23, i.e. in the case where the balance is in equilibrium, the beam 23 is maintained in a parallel position.

The magnetic material 17 is suspended from the end 23a of the beam 23 through a clamp bar 25. In similar fashion, a weight 26 is suspended from the other end 23b. A movable coil 27 is fixed on the beam 23 at right angles thereto and is located in a magnetic field generated by a magnet 29 arranged in proximity thereto. The movable coil 27 has the function of setting the balance beam 23 in motion about the supporting point by the Lorentz's force generated by the mutual operation between the current supplied from a current control unit 31 descried later and the magnetic field generated by the magnet 29. A mirror 28, the movable coil 27, is fixed similarly on the balance beam 23 at right angles thereto. In other words, the balance beam 23, the movable coil 27 and the mirror 28 are integrated and are driven by the imbalance of the forces exerted on the ends 23a and 23b and Lorentz's force acting on the movable coil 27.

An optical leverage 30 includes a light emitting unit for radiating light on the mirror 28 and a photo detector for receiving the light reflected from the mirror 28. The optical leverage 30 is arranged in opposed relation to the mirror 28. This optical leverage 30 feeds back the displacement between the receiving point of the reflected light and a predetermined position as a feedback signal to the current control unit 31. The current control unit 31, upon receipt of the feedback signal from the optical leverage 30, adjusts the magnitude of the current to be supplied to the movable coil 27 so that the displacement is zero, thereby maintaining the balance beam 23 in equilibrium. In the case where the balance beam 23 remains in equilibrium as a result of this feedback control, the output current of the current control unit 31 (the current flowing in the movable coil 27) is proportional to the force that the magnetic moment of the magnetic material 17 receives by the magnetic gradient. By the way, a differential amplifier 32 will be described later. In this case, therefore, the differential amplifier 32 is not assumed to be included in the magnetic balance 50.

The arithmetic unit 33 determines, as a measurement result, the remanence magnetization courve (residual magnetization, the distribution of anisotropic magnetic field, the distribution of easy axes, etc.) of the magnetic material 17 from the current input from the current control unit 31, while at the same time comparing the result of model calculation of the remanence magnetization courve of the magnetic material 17 with the measurement result described above. Now, let us show an example of the remanence magnetization courve (residual magnetization) of the magnetic material 17 based on the aforementioned model calculation with reference to FIG. 7. In the residual magnetization characteristic shown in FIG. 7, the abscissa represents the ratio between the applied magnetic field H and the anisotropic magnetic field $H_k$ ($H/H_k$), and the ordinate represents the ratio between the residual magnetization $M_r$ and the saturated residual magnetization $M_{rs}$ of the magnetic material 17 ($M_r/M_{rs}$), where the anisotropic magnetic field $H_k$ is a parameter unique to the sample (magnetic material 17).

Figure 7:
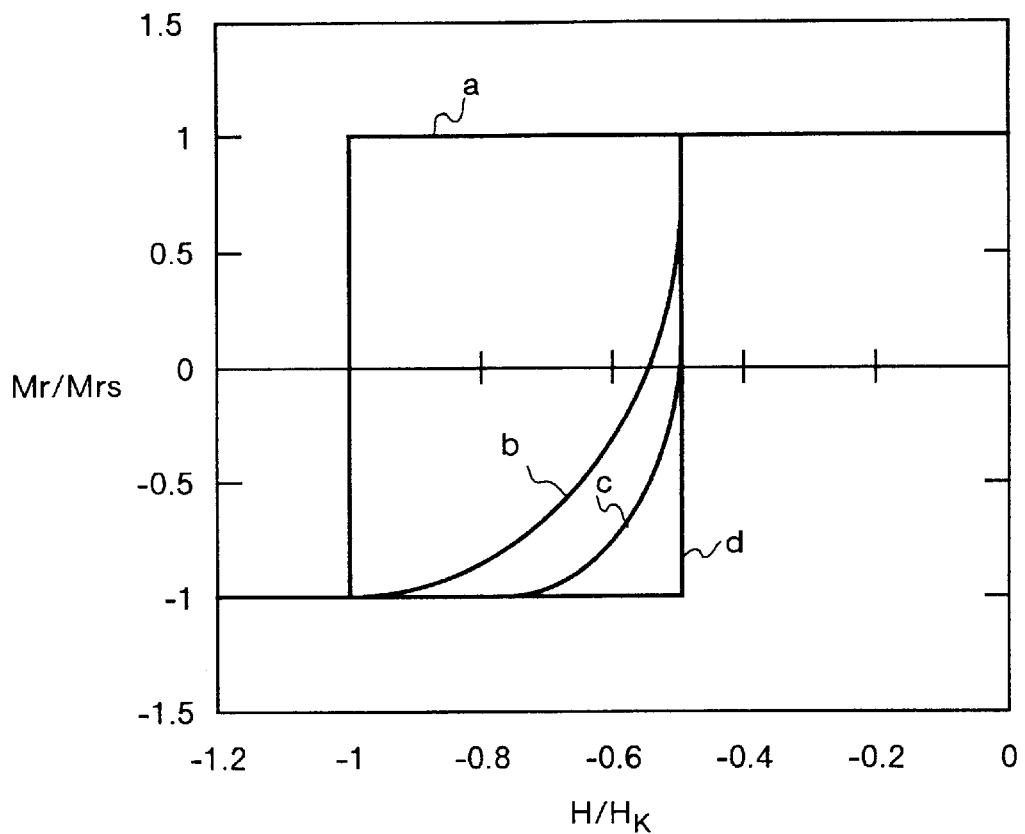
FIG. 7 is a diagram showing the remanence magnetization courve based on a model calculation of the magnetic material 17 shown in FIG. 1.

The characteristic curve a represents an example in which the magnetic field H is applied in the direction perpendicular to the surface of the vertical magnetization film of the magnetic material 17, and the characteristic curve b represents an example in which the magnetic field H is applied to the surface interior (0°) of the in-plane magnetization film of the magnetic material 17. The characteristic curve c, on the other hand, represents an example in which the magnetic field H is applied to the in-plane magnetization film from an angle of 45°, while the characteristic curve d represents the case in which the magnetic field H is applied to the vertical magnetization film at an angle of 45°. The remanence magnetization curve (residual magnetization characteristic) shown in FIG. 7 is determined by computer simulation of the parameters indicating the remanence magnetization courve of the magnetic material 17, the conditions of the magnetic field H, etc. The data of the remanence magnetization curve (residual magnetization characteristic) is held in a not illustrated storage unit of the arithmetic unit 33 in advance.

Now, the Kerr effect measuring unit 34 will be described in detail with reference to FIGS. 4 and 5. This Kerr effect measuring unit 34 is used for measuring the remanence magnetization curve (magnetization characteristic) of the magnetic material 17 in the state where a rapidly changing external magnetic field is applied to the magnetic material 17 by the first air-core coil 12 and the second air-core coil 13. This Kerr effect measuring unit 34 measures the remanence magnetization courve of the magnetic material 17 by utilizing the Kerr effect in which the radiation of the laser beam La to the magnetic material 17 causes the polarization plane of the reflected laser beam Lb to rotate in accordance with the direction of magnetization of the magnetic material 17.

Figure 5:
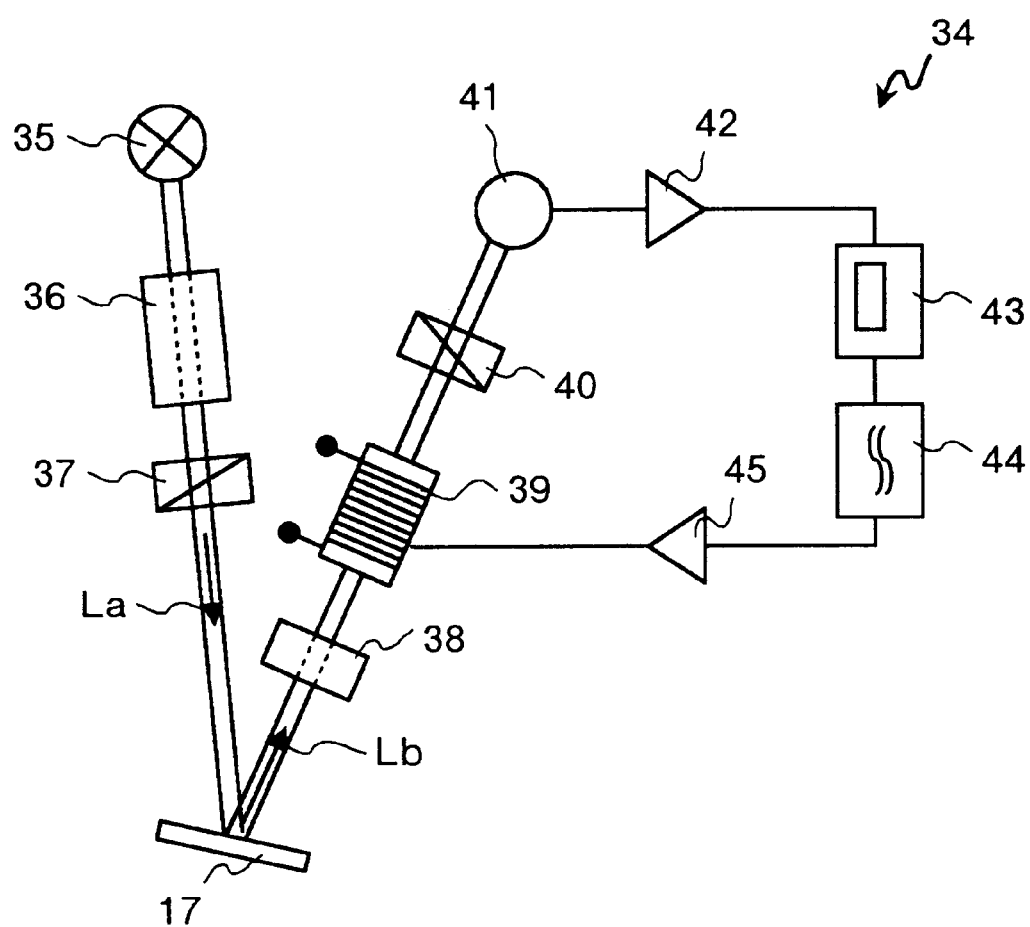
FIG. 5 is a diagram showing a configuration of the Kerr effect measuring unit 34 of FIG. 4.

The Kerr effect measuring unit 34 shown in FIG. 5 includes a light source 35 making up a light emitting system for generating the laser beam La, a spectroscope 36 for separating the laser beam La into single wavelength light components, and a polarizer 37 for converting the laser beam La into a linear polarized light and leading it to the magnetic material 17. Also, a photo-detection system includes a λ/4 wavelength plate 38 for applying the light path difference of one-fourth wavelength between the linear polarized light components of the reflected laser beam Lb from the magnetic material 17, a Faraday element 39 for rotating the plane of vibration of the reflected laser beam Lb by the Faraday effect, an analyzer 40 and a light detector 41 for converting the output light of the analyzer 40 into an electrical signal.

The photo-detection system further includes a preamplifier 42 for amplifying the output signal of the light detector 41, a lock-in amplifier (phase-fixed amplifier) 43 for amplifying the output signal of the preamplifier 42 in a narrow band with high gain, a low-frequency oscillator 44 fed back with the output signal of the lock-in amplifier 43 for generating a low-frequency signal, and a low-frequency amplifier 45 for amplifying the low-frequency signal and feeding it back as a current to the Faraday element 39. This Kerr effect measuring unit 34 is for a zero method measurement in which the reflected laser beam Lb arriving while rotating with the Kerr rotation angle is compensated by the Faraday element 39.

Specifically, the rotation of the polarization plane in the magnetic material 17 is offset by the current supplied to the Faraday element 39 through a feedback loop including the preamplifier 42, the lock-in amplifier 43, the low-frequency oscillator 44 and the low-frequency amplifier 45 so that the output signal of the light detector 41 is zero. Specifically, by defining the correspondence between the current of the Faraday element 39 and the Kerr rotation angle, the Kerr rotation angle can be determined from the current of the Faraday element 39. A polarizer 37 of high extinction ratio is used for an improved sensitivity. Also, the current of the Faraday element 39 is input to the arithmetic unit 33 shown in FIG. 4 as a result of detection of the Kerr effect measuring unit 34. This arithmetic unit 33 determines the Kerr rotation angle from the current described and further the remanence magnetization curve of the magnetic material 17.

Now, a measuring method using the magnetic material remanence curve measuring apparatus 10 according to the embodiment described above will be explained with reference to the flowchart of FIG. 6. First, the magnetic balance 50 shown in FIG. 3 is set at the upper end of the container 14 as the detector 18 shown in FIG. 1. The magnetic balance 50 is used for detecting, with high sensitivity, the magnetic moment which is very small because the magnetic material 17 is very thin. The VSM described above is so low in sensitivity and low in accuracy that it is not suitable for the measurement. On the other hand, taking the economic aspect thereof into account, SQUID which uses the expensive liquid helium, is inferior to the magnetic material remanence curve measuring apparatus according to an embodiment of the present invention.

With the balance set as described above, the thin-film magnetic material 17 is mounted at the forward end of the clamp bar 25. Specifically, the magnetic material 17 is suspended from an end 23a of the balance beam 23 through the clamp bar 25. Also, the position at which the magnetic material 17 is arranged is adjusted at a predetermined angle (0°, 45°, 90°) to the magnetic field H by a holder (not shown) as shown in FIG. 2. The position at which the magnetic material 17 is arranged is not limited to the angles mentioned above (0°, 45°, 90°) but maybe any arbitrary angle. Further, the holder (not shown) may be done without by providing an angle adjusting mechanism at the forward end of the clamp bar 25.

Figure 6:
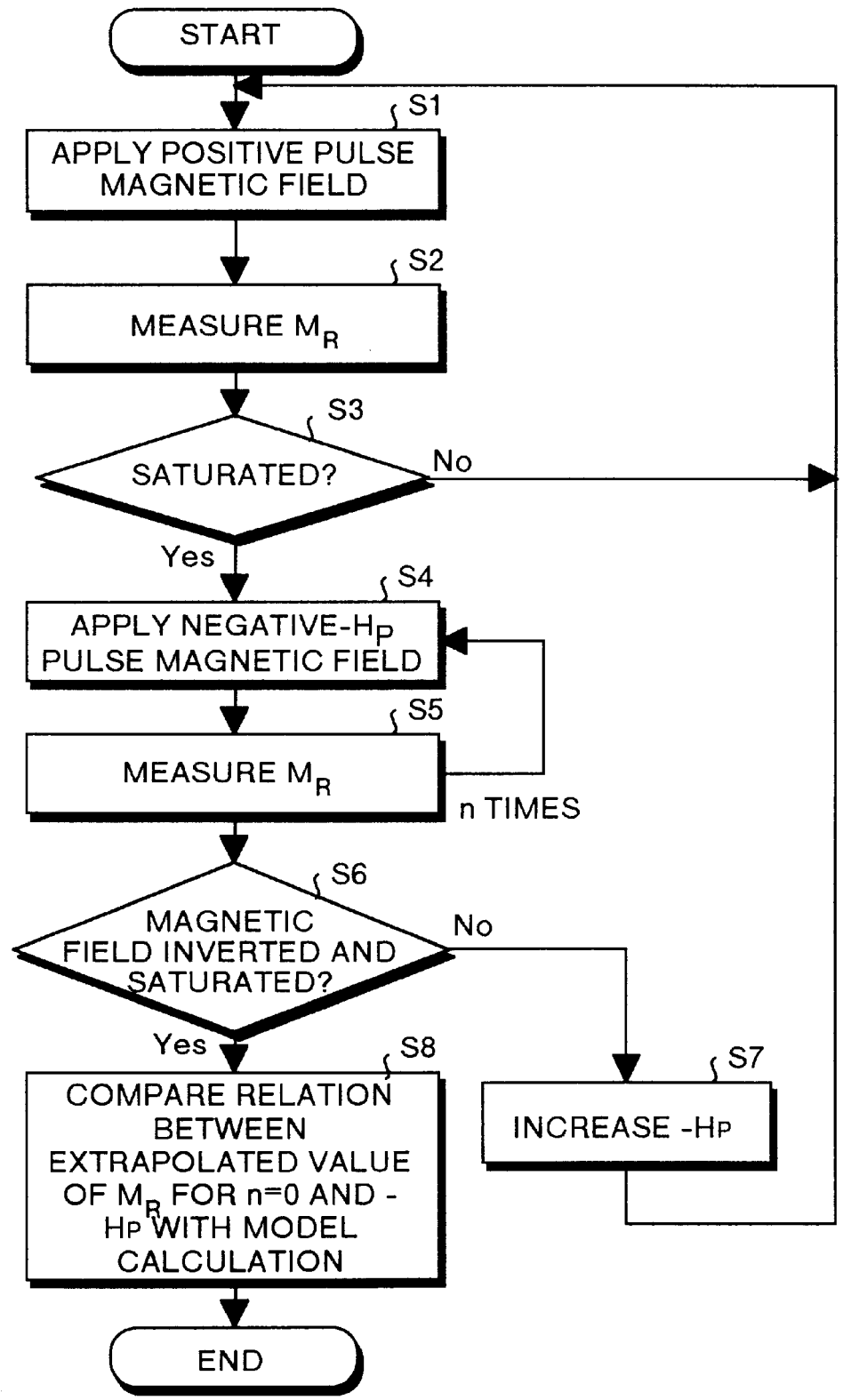
FIG. 6 is a flowchart for explaining a method for measuring the remanence curve of the magnetic material using the apparatus 10 according to an embodiment of the present invention.

In step S1 shown in FIG. 6, a positive magnetic field is applied to the magnetic material 17. Specifically, after the movable contact 21a is brought into contact with the contact 21c of the switch 21 by the control unit 22, the thyristor (not shown) of the pulse current source 20 is turned on. As a result, a positive pulse current having a steep rise characteristic is supplied from the pulse current source 20 to the first pulse magnetic field coil 15 and the second pulse magnetic field coil 16 through the switch 21. Let the capacitance of the condenser bank be C, the charge voltage be V, the inductance of the first pulse magnetic field coil 15 and the second pulse magnetic field coil 16 be L and the resistance component be zero. The pulse width w of the pulse current and the peak current $I_p$ are expressed by equations (1) and (2) below.

$$w = \pi \sqrt{(LC)} \tag{1}$$

$$I_p = V\sqrt{(C/L)} \tag{2}$$

The peak current $I_p$ assumes a value not higher than the allowable current value of the thyristor.

Upon application of a positive pulse current to the first pulse magnetic field coil 15 and the second pulse magnetic field coil 16, the pulse magnetic field rapidly changing in positive direction acts on and magnetizes the magnetic material 17. In the magnetic material remanence curve measuring apparatus 10, a pulse magnetic field changing as rapidly as 0.6 msec to 25 msec in terms of pulse width with a peak magnetic field of $10^3$ kVA/mm and a rise time of 100 ns to 100 ms can be exerted on the magnetic material 17.

Once the magnetic material 17 is magnetized by application of the pulse magnetic field thereto, the residual magnetization $M_R$ of the magnetic material 17 is measured in step S2. Specifically, after application of the pulse magnetic field, the control unit 22 controls the DC power supply 19 in such a manner that a positive current is output from one output terminal of the DC power supply 19 and a negative current from the other output terminal thereof. Then, the movable contact 21d of the switch 21 is brought into contact with the contact 21f and the movable contact 21g into contact with the contact 21h by the control unit 22.

As a result, a positive current is supplied to the first air-core coil 12 through the switch 21 from one output terminal of the DC power supply 19, while a negative current is supplied from the other output terminal through the switch 21 to the second air-core coil 13. Specifically, in this case, currents in reverse directions are supplied to the first air-core coil 12 and the second air-core coil 13. Conversely, the first air-core coil 12 may be supplied with a negative current, and the second air-core coil 13 with a positive current.

Once the first air-core coil 12 and the second air-core coil 13 are supplied with a positive current and a negative current, respectively, the direction of the magnetic field generated by the first air-core coil 12 and the direction of the magnetic field generated by the second air-core coil 13 become opposite to each other in the space in the neighborhood of the magnetic material 17. The space in the neighborhood of the magnetic material 17, therefore, comes to have a zero magnetic field and a finite magnetic field gradient. In other words, the magnetic material 17 is located in a space of zero magnetic field having a generally uniform magnetic field gradient in the direction perpendicular thereto. The magnetic field is set to zero in order to measure the residual magnetization of the magnetic material 17 with high sensitivity.

Under this condition, a force proportional to the magnetic moment of the magnetic material 17 acts on an end 23a of the balance beam 23 through the clamp bar 25, so that the end 23a of the balance beam 23 lowers while the end other end 23b of the balance beam 23 rises, for example, in accordance with the force described above. Consequently, the point at which the light reflected from the mirror 28 of the light leverage 30 is received is displaced from a predetermined point, so that a feedback signal corresponding to the amount of displacement is fed back from the light leverage 30 to the current control unit 31.

In response, the current control unit 31 adjusts the current value supplied to the movable coil 27, in such a manner that the amount of displacement is zero. As a result, Lorentz force corresponding to the current is exerted on the movable coil 27 so that the balance beam 23 is held in equilibrium. In the process, the value of the current output from the current control unit 31 to the arithmetic unit 33 is proportional to the magnetic moment of the magnetic material 17. Therefore, the arithmetic unit 33 determines the residual magnetization $M_R$ of the magnetic material 17 by determining the magnetic moment based on the value of the current.

Upon completion of the first session of measurement of the residual magnetization MR, the arithmetic unit 33 determines in step S3 whether the residual magnetization $M_R$ has been saturated or not. Specifically, the arithmetic unit 33 compares the previous measurement of the residual magnetization $M_R$ with the current measurement of the residual measurement $M_R$, and if there is no difference between them, the decision in step S3 is affirmative, while if there is any difference, the decision in step S3 is negative. This decision is notified to the control unit 22. In this case, assume that the decision in step S3 is negative, i.e. that the residual magnetization $M_R$ is not saturated. The process of steps S1 and S2 described above is executed. As a result, a positive pulse magnetic field is applied again to the magnetic material 17 (step S1), and the residual magnetization $M_R$ after this application is measured again (step S2). Subsequently until the decision in step S3 turns affirmative, i.e. until the residual magnetization $M_R$ of the magnetic material 17 is saturated, the process described above is repeated.

Once the difference between the previous measurement of the residual magnetization $M_R$ and the current measurement of the residual magnetization $M_R$ is eliminated in step S3, it is determined that the residual magnetization has been saturated and the decision becomes affirmative. After that the movable contacts $21_d$ and $21_g$ are opened. In response, in step S4, a pulse magnetic field (–Hp) in opposite direction (negative direction) to the pulse magnetic field in step S1 is applied to the magnetic material 17 of which the residual magnetization is saturated. Specifically, in step S4, the control unit 22 turns on the thyristor after controlling the pulse current source 20 to output a negative pulse current.

As a result, the negative pulse current is input to the first pulse magnetic field coil 15 and the second pulse magnetic field coil 16, and the inverted pulse magnetic field rapidly changing in negative direction is exerted on the magnetic material 17, thus inverting the magnetization of the magnetic material 17. Then, in step S5, as in step S2 described above, the residual magnetization $M_R$ of the magnetic material 17 is measured. The process of step S4 and the process of step S5 are repeated n times. In step S6, the arithmetic unit 33 determines from the measurement in step S5 whether the magnetic material 17 is inverted in magnetization and saturated according to whether the value has changed or not between the two measurements in the same manner as in step S3.

In this case, assume that the decision in step S6 is negative, i.e. that the magnetic material 17 is not inverted in magnetization and saturated. In step S7, the peak value of the pulse current supplied from the pulse current source 20 to the first pulse magnetic field coil 15 and the second pulse magnetic field coil 16 is increased under the control of the control unit 22, and then the process is returned to step S1, followed by the repetition of the process described above.

In the case where the decision in step S6 is affirmative, i.e. the magnetic material 17 is inverted in magnetization, the arithmetic unit 33 proceeds to step S8 and extrapolates the measurement in n=0 of the residual magnetization $M_R$. In other words, in step S8, based on the result of measurement in step S5, the change of the residual magnetization $M_R$ after application of an inverted pulse magnetic field is determined in the arithmetic unit 33. Then, from the actual data on the actual change, the residual magnetization $M_R$ immediately after application of the inverted pulse magnetic field is determined by estimation in step S4.

The process of change of the residual magnetization is considered to include the process for instantaneously switching from the state of high energy to the state of low energy upon application of an inverted pulse magnetic field and the process dependent on the time of magnetic field application due to the thermal excitation. This indicates that the contribution of only the former one of the two processes can be estimated by determining, by estimation from the actual data, the residual magnetization $M_R$ immediately after application of the inverted pulse magnetic field. Then, the arithmetic unit 33 compares the measurement (residual magnetization $M_R$ ) with the remanence magnetization curve (residual magnetization) based on the model calculation shown in FIG. 7 and determines it as the final measurement.

Figure 8A:
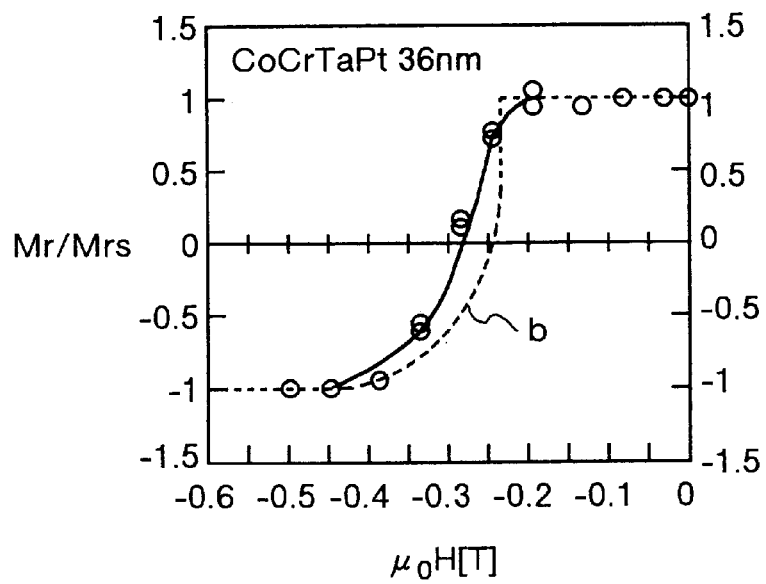
FIG. 8A and FIG. 8B are diagrams showing a measurement example 1 of the apparatus 10 for measuring the remanence curve of the magnetic material according to an embodiment of the present invention.
Figure 8B:
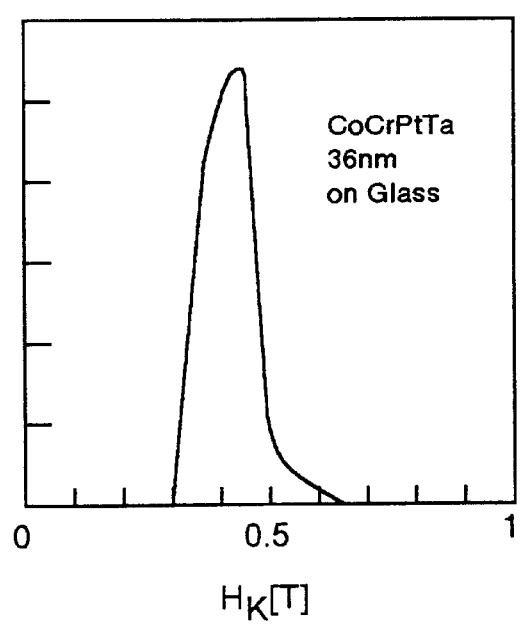

Examples 1 and 2 of the measurement in the magnetic material remanence curve measuring apparatus 10 are explained with reference to FIGS. 8 and 9. FIG. 8A shows an example of comparison between the model calculation represented by the characteristic curve b in FIG. 7 and the actual measurement represented by the dashed line. The abscissa represents the product of the permeability $\mu_o$ in vacuum and the magnetic field H, and the ordinate the ratio between the residual magnetization $M_r$ and the saturated residual magnetization $M_{rs}$ ($M_r/M_{rs}$). Also, the magnetic material 17 is composed of CoCrTaPt and has a thickness of 36 nm. As understood from this diagram, the measurement result in the magnetic material remanence curve measuring apparatus 10 is very similar to the characteristic curve b in the model calculation.

It follows, therefore, that the measurement in the magnetic material remanence curve measuring apparatus 10 is very reliable. It is also possible to determine in the arithmetic unit 33 the distribution of the anisotropic magnetic field indicating the relation with the ratio of the component particles of the anisotropic magnetic field $H_k$ shown in FIG. 8B by comparing it with the characteristic curve b of FIG. 8A. The anisotropic magnetic field $H_k$ can be determined from the formula 2Ku (anisotropic energy)/M (magnetization), and the anisotropic energy $K_u$ assumes a value unique to the sample (magnetic material 17).

Figure 9A:
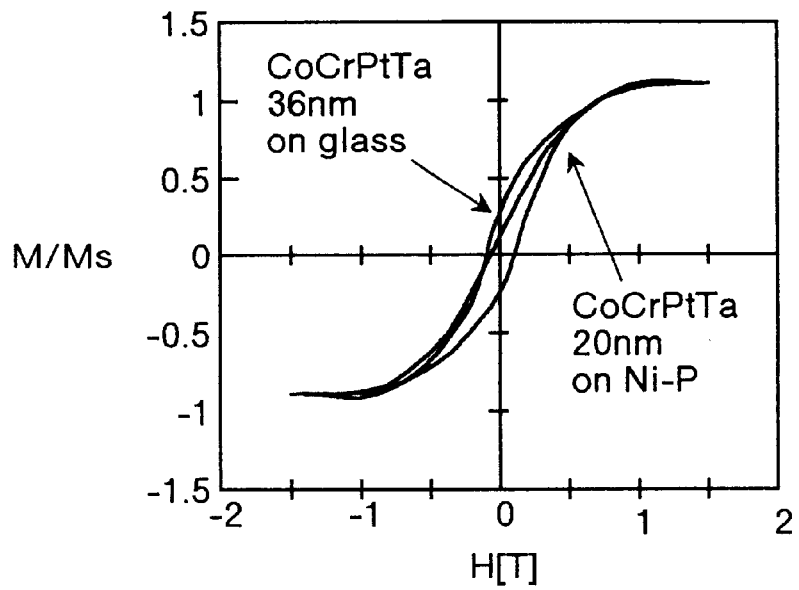
FIG. 9A and FIG. 9B are diagrams showing a measurement example 2 of the apparatus 10 for measuring the remanence curve of the magnetic material according to the same embodiment of the present invention.
Figure 9B:
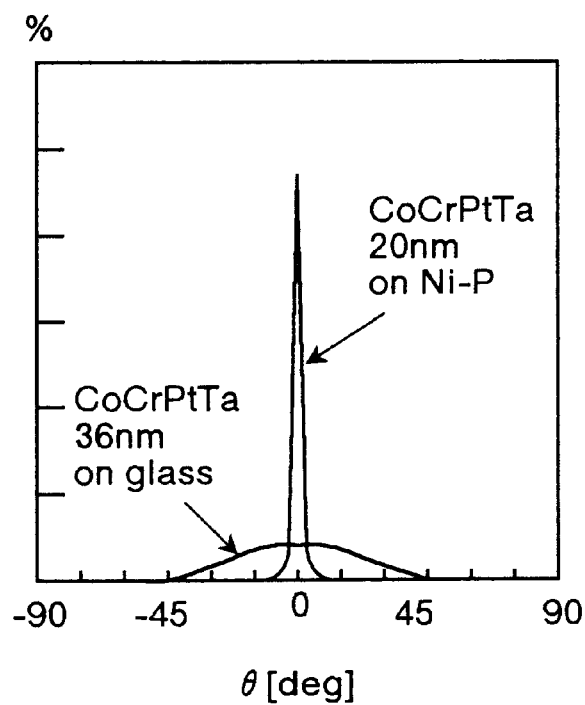

Also, the measurement shown in FIGS. 9A and 9A represents the case in which a magnetic field is applied in the direction perpendicular to the in-plane magnetization film of the magnetic material 17. FIG. 9A shows the hysteresis characteristics of different forms of samples including the magnetic material 17 having the thickness of 36 nm made of CoCrPtTa formed on glass and the magnetic material 17 having the thickness of 20 nm composed of CoCrPtTa formed on Ni—P. In FIG. 9A, the abscissa represents the magnetic field H, and the ordinate the ratio ($M/M_s$) between the magnetization M and the saturated magnetization $M_s$ of the magnetic material 17. In the arithmetic unit 33, on the other hand, the distribution of the easy axis θ shown in FIG. 9B can be determined from the measurement of FIG. 9A. The easy axis θ is the one along which the magnetization can be easily positioned.

Now, an explanation will be given of a method of measuring the process of relaxing the magnetization at the time of rapid change of the magnetic field by applying an inverted magnetic field with rapidity to the magnetic material 17 saturated with the residual magnetization. This measurement is suitable for evaluation of the stability of the magnetic recording in the state where the inverted magnetic field such as actual recording bits are exerted on the magnetic material 17. In FIG. 4, assume that the magnetic material 17 is saturated with residual magnetization due to the process of steps S1 to S3 described above (FIG. 6). In this state, the control unit 22 controls the DC power supply 19 in such a manner as to output a current in the same direction from the two output terminals of the DC power supply 19, and then the movable contact 21d is brought into contact with the contact 21f, while the movable contact 21g is brought into contact with the contact 21h. After the lapse of a predetermined time, the control unit 22 opens the movable contact 21d and the movable contact 21g.

As a result, a current flows in the first air-core coil 12 and the second air-core coil 13 in the same direction, so that a steady magnetic field is exerted on the magnetic material 17. This steady magnetic field changes rapidly from positive to negative direction, and then rapidly approaches to zero. The first air-core coil 12 and the second air-core coil 13 are composed of a superconductive coil (capable of generating $5 \times 10^3$ kA/m) in the case where a slow rate of change of the steady magnetic field is allowable. In the case where a comparatively rapid change of the magnetic field is desirable, on the other hand, a normal conductive coil (capable of generating $1 \times 10^3$ kA/m) is used. Also, by supplying a current of 30 A to a coil of copper wire having an inner diameter of 50 mm as the first air-core coil 12 and the second air-core coil 13, a steady magnetic field of 0.26 T is generated. Further, by cooling the first air-core coil 12 and the second air-core coil 13 with liquid nitrogen, the steady magnetic field reached about 1 T.

With the rapid approach of the steady magnetic field to zero, the residual magnetization of the magnetic material 17 changes through the relaxation process. In the process, the residual magnetization characteristic of the magnetic material 17 from the time of inversion of the rapidly-changing magnetic field due to the steady magnetic field to the time when the change comes to stop and the residual magnetization characteristic after the stop (relaxation process) are measured by the Kerr effect measuring unit 34 shown in FIG. 4. Specifically, when a laser beam La (linearly polarized light) is applied to the magnetic material 17 and reflected as a laser beam Lb, the vibration plane of the reflected laser beam Lb rotates in proportion to the magnetization of the magnetic material 17. This rotation angle (Kerr rotation angle) is proportional to the current of the Faraday element 39 as described above. Thus, the arithmetic unit 33 shown in FIG. 4 determines the residual magnetization characteristic of the magnetic material 17 based on the current of the Faraday element 39.

In addition to the configuration shown in FIG. 5, the Kerr effect measuring unit 34 can have any configuration as far as the Kerr effect is produced. Example other configurations include the one, though somewhat time-consuming, using the extinction method with the analyzer rotated, and the one in which the analyzer is set at an appropriate angle to detect the intensity of the transmitted light and thus to measure the rapid magnetization change directly.

Further, in a configuration for grasping the rapid magnetization change, a short pulse laser for generating a short pulse laser light of high repetitive frequency is used as a light source, and after the light detection for each pulse laser, the detection result is applied to a high-speed digital scope. In this high-speed digital scope, the longitudinal Kerr effect and the lateral Kerr effect can be measured for the in-plane magnetization film and the vertical magnetization film of the magnetic material 17.

In the magnetic material remanence curve measuring apparatus 10 according to an embodiment described above, the movable contact 21a of the switch 21 shown in FIG. 1 is brought into contact with the contact 21b, the movable contact 21d into contact with the contact 21e and the movable contact 21i into contact with the contact 21j. In this way, the pulse current can be supplied from the pulse current source 20 to the first air-core coil 12 and the second air-core coil 13. In this case, a pulse magnetic field with a comparatively large pulse width is obtained.

As described above, in the magnetic material remanence curve measuring apparatus 10 according to an embodiment, the first pulse magnetic field coil 15 and the second pulse magnetic field coil 16 are provided to exert a rapidly-changing magnetic field on the magnetic material 17. The remanence magnetization curve (residual magnetization characteristic) can be measured under conditions similar to the practical conditions with the magnetic material 17 actually built in the magnetic disk device. Also, with the magnetic material remanence curve measuring apparatus 10 according to the embodiment described above, a magnetic balance 50 (Kerr effect measuring apparatus 34) of high sensitivity is used as a detector, and therefore highly accurate measurements (see FIG. 8A) can be obtained under the practical conditions described above.

The magnetic material remanence curve measuring apparatus 10 according to an embodiment of the present invention has been described in detail above with reference to the drawings. Specific configurations of the present invention are not limited to the one shown in the embodiment, but all design changes not departing from the scope and spirit of the present invention are included in the present invention with equal effect. In the magnetic material remanence curve measuring apparatus 10 according to the embodiment described above, for example, the differential amplifier 32 shown in FIG. 3 can be included so that the remanence magnetization courve of the magnetic material 17 are measured based on the output of the differential amplifier 32. Specifically, in the case where the differential amplifier 32 is used, the difference between the output of the current control unit 31 with the magnetic field gradient in positive direction in the neighborhood of the magnetic material 17 and the output of the current control unit 31 with the magnetic field gradient in negative direction is amplified and applied to the arithmetic unit 33. In other words, in this case, the difference is taken to cancel the error component due to the drift of the magnetic balance 50, and therefore the measurement of the arithmetic unit 33 is improved in accuracy. Also, according to an embodiment, the magnetic balance 50 and the Kerr effect measuring apparatus 34 may be replaced with each other for measurement.

Figure 10:
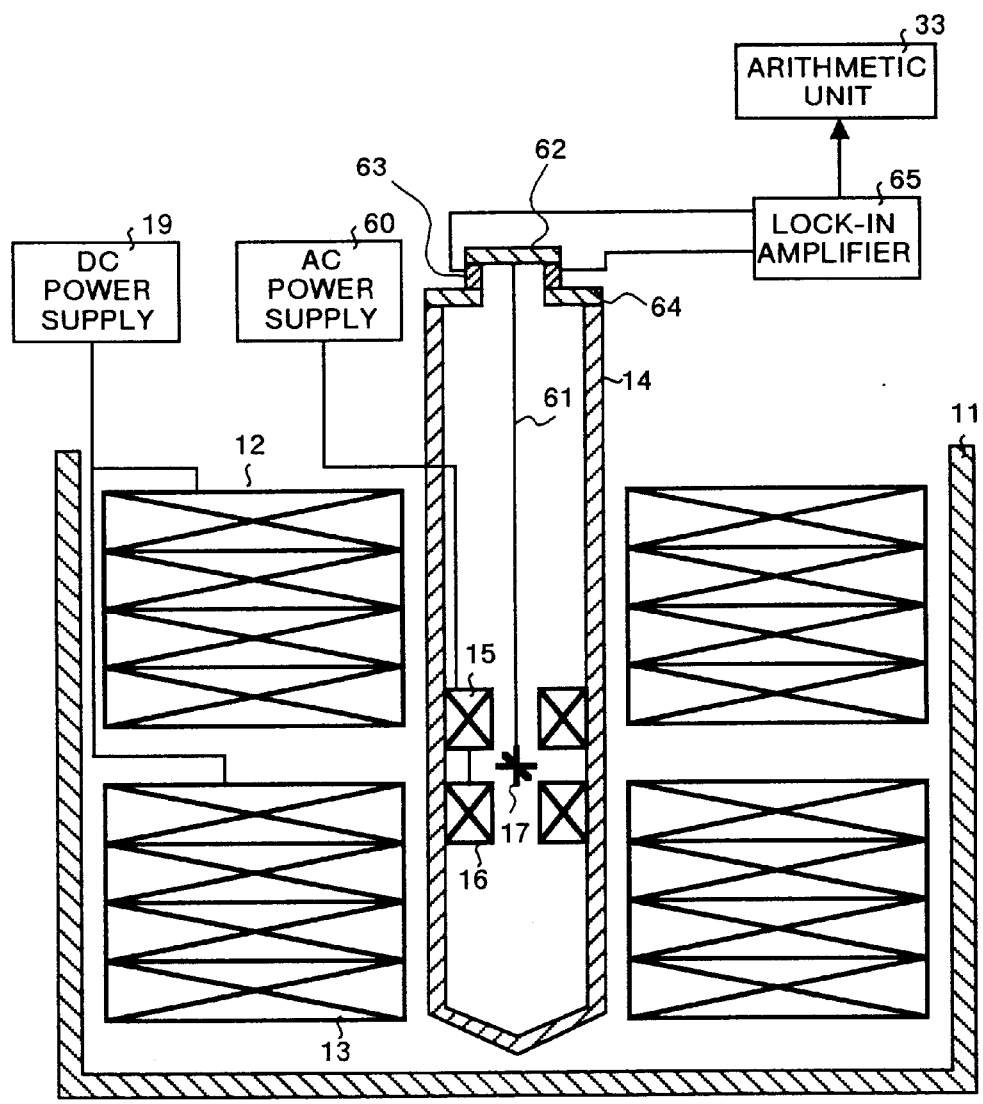
FIG. 10 is a diagram showing a modification 1 of the apparatus 10 for measuring the remanence curve of the magnetic material according to the same embodiment of the present invention.

Further, in the magnetic material remanence curve measuring apparatus 10 according to the embodiment described above, a detector having a configuration as shown in FIG. 10 may be used in place of the Kerr effect measuring apparatus 34 shown in FIG. 4. This detector includes an AC power supply 60, a clamp bar 61, a pressure transmission plate 62, a piezoelectric element 63, a support 64 and a lock-in amplifier 65. The AC power supply 60 generates an alternating force for the magnetic material 17 by supplying an AC current to the first pulse magnetic field coil 15 and the second pulse magnetic field coil 16. The clamp bar 61 has the upper end thereof connected to the pressure transmission plate 62, and the lower end thereof connected to the magnetic material 17 through a holder (not shown). The pressure transmission plate 62 is supported on the support 64 at the upper end of the vessel 14 through the piezoelectric element 63 for generating a voltage corresponding to the applied pressure. The lock-in amplifier 65 amplifies the output voltage of the piezoelectric element 63 with a high gain and outputs it to the arithmetic unit 33.

In the configuration described above, assume that a space having a zero magnetic field and a finite magnetic field gradient is formed around the magnetic material 17 by the first air-core coil 12 and the second air-core coil 13. When an AC current is supplied from the AC power supply 60 to the first pulse magnetic field coil 15 and the second pulse magnetic field coil 16, the alternating force is exerted on the magnetic material 17. The alternating force is transmitted to the support 64 through the clamp bar 61 and the pressure transmission plate 62, and a voltage corresponding to the alternating force is output to the lock-in amplifier 65 from the piezoelectric element 63. This voltage is amplified by the lock-in amplifier 65, and input to the arithmetic unit 33 thereby to produce the remanence magnetization curve of the magnetic material 17. The use of the piezoelectric element 63 makes this configuration difficult to be affected by a drift or the like as compared with the magnetic balance 50, thereby further improving the detection sensitivity (measurement accuracy).

The magnetic material remanence curve measuring apparatus 10 according to the embodiment described above has such a configuration that both the zero magnetic field (magnetic field gradient) and the steady magnetic field can be generated by the first air-core coil 12 and the second air-core coil 13 shown in FIG. 1. The present invention is not limited to this configuration, however, but may include a configuration in which as shown in FIG. 11, a coil for generating the zero magnetic field (magnetic field gradient) (a first magnetic field gradient coil 70 and a second magnetic field gradient coil 71) is provided separately from a coil for generating the steady magnetic field (a first normal magnetic field coil 72 and a second normal magnetic field coil 73).

Figure 11:
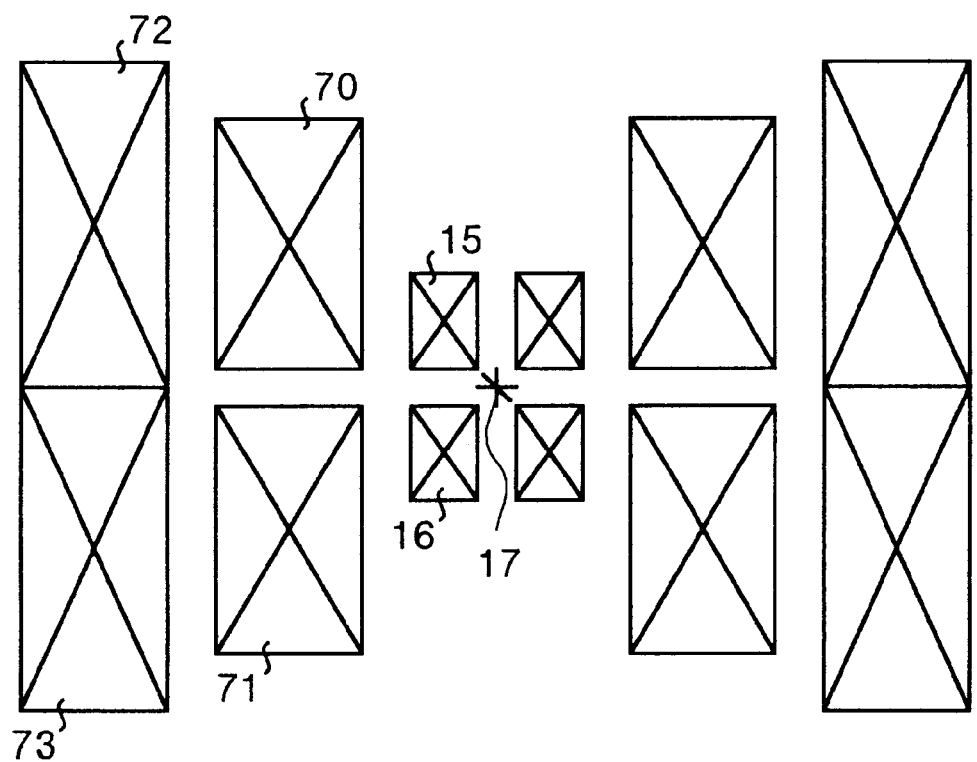
FIG. 11 is a diagram showing a modification 2 of the apparatus 10 for measuring the remanence curve of the magnetic material according to the same embodiment of the present invention.

As shown in FIG. 11, the first magnetic field gradient coil 70 and the second magnetic field gradient coil 71 are arranged coaxially outside of the first pulse magnetic field coil 15 and the second pulse magnetic field coil 16. Further, the first normal magnetic field coil 72 and the second normal magnetic field coil 73 are coaxially arranged outside of the first magnetic field gradient coil 70 and the second magnetic field gradient coil 71. Also, in FIG. 11, the first magnetic field gradient coil 70 and the second magnetic field gradient coil 71 are supplied with currents in opposite directions, while the first normal magnetic field coil 72 and the second normal magnetic field coil 73 are supplied with currents in the same direction.

As described above, according to the first and seventh aspects of the present invention, the pulse magnetic field applied to a magnetic material by the pulse magnetic field applying unit is changing rapidly under conditions similar to practical conditions, and the measuring unit measures the remanence magnetization courve based on the principle for detecting the force received by the magnetic moment from the magnetic field gradient. As compared with the conventional detection coil, therefore, a high sensitivity is obtained even with a magnetic material having a very small magnetic moment. In this way, according to the first and seventh aspects of the present invention, the measurements corresponding to practical conditions can be obtained with a higher accuracy of the measurement result.

According to the second aspect of the present invention, the pulse magnetic field applied to a magnetic material by the pulse magnetic field application unit is changing rapidly under conditions similar to practical conditions, and the measuring unit measures the remanence magnetization courve based on the detection result of the polarized state of the light using the Kerr effect. As compared with the conventional detection coil, therefore, a high sensitivity is obtained even with a magnetic material having a very small magnetic moment. In this way, according to the second aspect of the present invention, the measurements corresponding to practical conditions can be obtained with a higher accuracy of the measurement result.

According to the third aspect of the present invention, a pulse magnetic field changing as rapidly as 100 ns to 100 ms is applied to the magnetic material by the pulse magnetic field applying unit. Therefore, the remanence magnetization courve can be measured under substantially the same conditions as practical applications for a hard disk device or the like.

According to the fourth aspect of the present invention, the angle at which the magnetic material is arranged is adjusted arbitrarily by the angle adjusting unit, so that an actual magnetic field for the head having an angular component can be produced in simulation. Therefore, not only practical conditions can be met but also variations of the measuring methods can be increased at the same time.

According to the fifth aspect of the present invention, a space with a zero magnetic field and a finite magnetic field gradient is generated by the magnetic field gradient generating unit, and therefore the residual magnetization (remanence magnetization curve) of the magnetic material after application of the pulse magnetic field can be measured very accurately.

According to the sixth aspect of the present invention, a steady magnetic field can be exerted on the magnetic material by the steady magnetic field generating unit, and therefore the remanence magnetization curve of the magnetic material in the steady magnetic field (external magnetic field) can be measured for an improved general-purpose applicability. Further, according to the sixth aspect of the present invention, the change in the remanence magnetization courve in the steady magnetic field can be measured using the Kerr effect.

According to the eighth aspect of the present invention, the pulse magnetic field applied to a magnetic material in the pulse magnetic field application process is changing rapidly under conditions similar to practical conditions, and the remanence magnetization curve is measured in the measuring process based on the principle for detecting the force received by the magnetic moment from the magnetic field gradient. As compared with the conventional detection coil, therefore, a high sensitivity is obtained even with a magnetic material having a very small magnetic moment. In this way, according to the eighth aspect of the present invention, the measurements corresponding to practical conditions can be obtained with a higher accuracy of the measurement result.

According to the ninth aspect of the present invention, the pulse magnetic field applied to a magnetic material in the pulse magnetic field application process is changing rapidly under conditions similar to practical conditions, and the remanence magnetization courve are measured in the measuring process based on the detection result of the polarized state of the light using the Kerr effect. As compared with the conventional detection coil, therefore, a high sensitivity is obtained even with a magnetic material having a very small magnetic moment. In this way, according to the ninth aspect of the present invention, the measurements corresponding to practical conditions can be obtained with a higher accuracy of the measurement result.

According to the tenth aspect of the present invention, a space having a zero magnetic field and a finite magnetic field gradient is generated in the magnetic field gradient generating process, and therefore the residual magnetization (remanence magnetization curve) of the magnetic material after application of the pulse magnetic field can be measured very accurately.

According to the eleventh aspect of the present invention, a steady magnetic field can be exerted on a magnetic material in the steady magnetic field generating process, and therefore the remanence magnetization courve of the magnetic material in the steady magnetic field (external magnetic field) can be measured for an improved general-purpose applicability.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for measuring magnetic characteristics of a magnetic recording material, the apparatus comprising:
a pulse magnetic field applying unit for applying a rapidly-changing pulse magnetic field of positive or negative polarity to said magnetic recording material;
a measurement unit for measuring a residual magnetization of said magnetic recording material; and
a saturation-state determining unit for determining whether the residual magnetization of said magnetic recording material measured by said measurement unit is in a saturated state or not,
wherein said pulse magnetic field applying unit applies said magnetic field of positive polarity to said magnetic recording material, said measurement unit measures said residual magnetization of said magnetic recording material, and said saturation-state determining unit determines whether said measured residual magnetization is in said saturated state or not,
wherein when said saturation-state determining unit determines that said measured residual magnetization is not in said saturated state, then application of said magnetic field of positive polarity by said pulse magnetic field applying unit, measurement of said residual magnetization by said measurement unit, and determination by said saturation-state determining unit are repeated until said saturation-state determining unit determines that said measured residual magnetization is in the saturated state, and
wherein when said saturation-state determining unit determines that said measured residual magnetization is in said saturated state, then said pulse magnetic field applying unit applies said magnetic field of negative polarity to said magnetic recording material, and said measurement unit measures said residual magnetization of said magnetic recording material.

2. The apparatus according to clam 1, wherein said pulse magnetic field applying unit applies said pulse magnetic field with a rise time in the range of 100 ns to 100 ms to said magnetic recording material.

3. The apparatus according to claim 1, further comprising an angle adjusting unit for arbitrarily adjusting an angle at which said magnetic recording material is arranged with respect to said pulse magnetic field.

4. The apparatus according to claim 1, further comprising a magnetic field gradient generating unit for generating a magnetic field gradient in a space having a zero magnetic field and a finite magnetic field gradient around said magnetic recording material when said pulse magnetic field is applied.

5. The apparatus according to claim 1, further comprising a steady magnetic field generating unit for generating a steady magnetic field in a space around said magnetic recording material when said pulse magnetic field is applied.

6. The apparatus according to claim 1, wherein said magnetic recording material is made of a hard magnetic material or a semi-hard magnetic material.

7. An apparatus for measuring magnetic characteristics of a magnetic recording material, the apparatus comprising:
- a pulse magnetic field applying unit for applying a rapidly-changing pulse magnetic field of positive or negative polarity to said magnetic recording material;
- a measurement unit for measuring a residual magnetization of said magnetic recording material by use of the Kerr effect; and
- a saturation-state determining unit for determining whether said residual magnetization of said magnetic recording material measured by said measurement unit is in a saturated state or not,
- wherein said pulse magnetic field applying unit applies said magnetic field of positive polarity to said magnetic recording material, said measurement unit measures said residual magnetization of said magnetic recording material, and said saturation-state determining unit determines whether said measured residual magnetization is in said saturated state or not,
- wherein when said saturation-state determining unit determines that said measured residual magnetization is not in said saturated state, then application of said magnetic field of positive polarity by said pulse magnetic field applying unit, measurement of said residual magnetization by said measurement unit, and determination by said saturation-state determining unit is repeated until said saturation-state determining unit determines that said measured residual magnetization is in the saturated state, and
- wherein when said saturation-state determining unit determines that said measured residual magnetization is in said saturated state, then said pulse magnetic field applying unit applies said magnetic field of negative polarity to said magnetic recording material, and said measurement unit measures said residual magnetization of said magnetic recording material.

8. The apparatus according to claim 7, wherein said pulse magnetic field applying unit applies said pulse magnetic field with a rise time in the range of 100 ns to 100 ms to said magnetic recording material.

9. The apparatus according to claim 7, further comprising an angle adjusting unit for arbitrarily adjusting an angle at which said magnetic recording material is arranged with respect to said pulse magnetic field.

10. The apparatus according to claim 7, further comprising a magnetic field gradient generating unit for generating a magnetic field gradient in a space having a zero magnetic field and a finite magnetic field gradient around said magnetic recording material when the pulse magnetic field is applied.

11. The apparatus according to claim 7, further comprising a steady magnetic field generating unit for generating a steady magnetic field in a space around said magnetic recording material when said pulse magnetic field is applied.

12. The apparatus according to claim 7, wherein said magnetic recording material is made of a hard magnetic material or a semi-hard magnetic material.

13. A method for measuring magnetic characteristics of a magnetic recording material, the method comprising the steps of:
- applying a rapidly-changing pulse magnetic field of positive or negative polarity to said magnetic recording material;
- measuring a residual magnetization of said magnetic recording material; and
- determining whether said measured residual magnetization of said magnetic recording material is in a saturated state or not,
- wherein said magnetic field of positive polarity is applied to said magnetic recording material, said residual magnetization of said magnetic recording material is measured, and it is determined whether said measured residual magnetization is in said saturated state or not,
- wherein when it is determined that said residual magnetization is not in said saturated state, then application of said magnetic field of positive polarity to said magnetic recording material, measurement of said residual magnetization of said magnetic recording material, and determination of whether said measured residual magnetization is in said saturated state or not is repeated until it is determined that said measured residual magnetization of said magnetic recording material is in said saturated state, and
- wherein when it is determined that said measured residual magnetization is in said saturated state, then said magnetic field of negative polarity is applied to said magnetic recording material, and said residual magnetization of said magnetic recording material is measured.

14. The method according to claim 13, the method further comprising:
- the step of generating a magnetic field gradient in a space of a zero magnetic field and a finite magnetic field gradient around said magnetic recording material when said pulse magnetic field is applied, said generating step being executed after execution of said pulse magnetic field applying step and before execution of said measuring step.

15. The method according to claim 13, the method further comprising:
- the step of generating a steady magnetic field in a space around said magnetic recording material when said pulse magnetic field is applied, said generating step being executed after execution of said pulse magnetic field applying step and before execution of said measuring step.

16. A method for measuring magnetic characteristics of a magnetic recording material, the method comprising the steps of:
- applying a rapidly-changing pulse magnetic field of positive or negative polarity to said magnetic recording material;
- measuring a residual magnetization of said magnetic recording material by use of the Kerr effect; and
- determining whether said measured residual magnetization of said magnetic recording material is in a saturated state or not,
- wherein said magnetic field of positive polarity is applied to said magnetic recording material, said residual magnetization of said magnetic recording material is measured, and it is determined whether said measured residual magnetization is in said saturated state or not,
- wherein when it is determined that said residual magnetization is not in said saturated state, then application of said magnetic field of positive polarity to said magnetic recording material, measurement of said residual magnetization of said magnetic recording material, and determination of whether said measured residual magnetization is in said saturated state or not is repeated until it is determined that the measured residual magnetization of said magnetic recording material is in said saturated state, and wherein when it is determined that said measured residual magnetization is in said saturated state, then said magnetic field of negative polarity is applied to said magnetic recording material, and said residual magnetization of said magnetic recording material is measured.

17. The method according to claim 16, the method further comprising:

the step of generating a magnetic field gradient in a space of a zero magnetic field and a finite magnetic field gradient around said magnetic recording material when said pulse magnetic field is applied, said generating step being executed after execution of said pulse magnetic field applying step and before execution of said measuring step.

18. The method according to claim 16, the method further comprising:

the step of generating a steady magnetic field in the space around said magnetic recording material when said pulse magnetic field is applied, said generating step being executed after execution of said pulse magnetic field applying step and before execution of said the measuring step.

19. The apparatus according to claim 1, further comprising:

a model storing unit for storing beforehand a model of the magnetic characteristics of said magnetic recording material; and a comparing unit for comparing said measured residual magnetization of said magnetic recording material with said stored model.

20. The apparatus according to claim 7, further comprising:

a model storing unit for storing beforehand a model of the magnetic characteristics of said magnetic recording material; and a comparing unit for comparing said measured residual magnetization of said magnetic recording material with said stored model.

21. The method according to claim 13, further comprising:

the step of storing beforehand a model of the magnetic characteristics of said magnetic recording material; and the step of comparing said measured residual magnetization of said magnetic recording material with said stored model.

22. The method according to claim 16, further comprising:

the step of storing beforehand a model of the magnetic characteristics of said magnetic recording material; and the step of comparing said measured residual magnetization of said magnetic recording material with said stored model.

23. The apparatus according to claim 1, wherein said pulse magnetic field applying unit includes a combination of coils which generate said rapidly-changing pulse magnetic field.

24. The apparatus according to claim 7, wherein said pulse magnetic field applying unit includes combination of coils which generate said rapidly-changing pulse magnetic field.

* * * * *

UNITED STATES PATENT AND TRADEMARK OFFICE
CERTIFICATE OF CORRECTION

PATENT NO. : 6,407,545 B1
DATED : June 18, 2002
INVENTOR(S) : Kenji Sato, Takuya Uzumaki and Tadashi Mizoguchi It is certified that error appears in the above-identified patent and that said Letters Patent is hereby corrected as shown below:

<u>Title page,</u>
Item [73], Assignee: please delete "Fujitsu Limited, Kawasaki (JP)" and insert
-- [73] Assignees: Fijitsu Limited, Kawasaki (JP) and Tadashi Mizoguchi, Tokyo (JP) -- therefor.

Signed and Sealed this

Fourth Day of February, 2003

JAMES E. ROGAN
*Director of the United States Patent and Trademark Office*